United States Patent [19]

Cole, Jr. et al.

[11] Patent Number: 4,617,085
[45] Date of Patent: Oct. 14, 1986

[54] PROCESS FOR REMOVING ORGANIC MATERIAL IN A PATTERNED MANNER FROM AN ORGANIC FILM

[75] Inventors: Herbert S. Cole, Jr.; Yung S. Liu; Herbert R. Philipp, all of Scotia, N.Y.

[73] Assignee: General Electric Company, Schenectady, N.Y.

[21] Appl. No.: 771,956

[22] Filed: Sep. 3, 1985

[51] Int. Cl.$^4$ .................. B44C 1/22; B29C 17/08; C03C 15/00; C03C 25/06
[52] U.S. Cl. ................................. 156/643; 156/655; 156/668; 219/121 LM; 427/53.1; 427/54.1
[58] Field of Search ............ 156/643, 654, 655, 659.1, 156/661.1, 668, 904; 427/43.1, 53.1, 54.1, 272; 430/329; 219/121 LH, 121 LJ, 121 LM; 250/492.1

[56] References Cited

U.S. PATENT DOCUMENTS 3,664,899  5/1972  Wright et al.
4,414,059  11/1983  Blum et al.
4,417,948  11/1983  Mayne-Banton et al.

OTHER PUBLICATIONS

H. S. Cole, Y. S. Liu & H. W. Philipp, "Dependence of Photoetching Rates of Photoetching Rates of Polymers at 193 nm on Optical Absorption Coefficiencies", General Electric Corporate Research & Development, Schenectady, N.Y. 12301.

M. Latta, R. Moore, S. Rice & K. Jain, "Excimer Laser Projection Photoetching", J. Appl. Phys. 56 (2) (Jul. 15, 1984), pp. 586–588.

K. Jain & R. T. Kerth, "Excimer Laser Projection Lithography", Applied Optics 23 (5) (Mar. 1, 1984), pp. 648–650.

R. T. Miller, "Heatless Laser Etching", IBM Research Highlights, No. 3, (1983), IBM Research Laboratories.

R. Srinivasan & B. Braren, "Ablative Photodecomposition of Polymer Films by Pulsed Far-Ultraviolet (193 nm) Laser Radiation: Dependence of Etch Depth on Experimental Conditions", J. of Polymer Science: Polymer Chemistry Ed., 22 (1984), pp. 2601–2609.

R. Srinivasan, "Microscopic Model for the Ablative Photodecomposition of Polymers by Far-Ultraviolet Radiation (193 nm)", Appl. Phys. Lett. 44 (9) (May 1, 1984), pp. 849–851.

Primary Examiner—William A. Powell
Attorney, Agent, or Firm—William A. Teoli; James C. Davis, Jr.; James Magee, Jr.

[57] ABSTRACT

A method is provided for removing organic material from an organic film in a patterned manner using ultraviolet light at sufficient power density to effect the patterned ablative photodecomposition of an organic film in the form of a blend of aliphatic and aromatic organic material or a copolymer of chemically combined aliphatic units and aromatic units.

7 Claims, 1 Drawing Figure

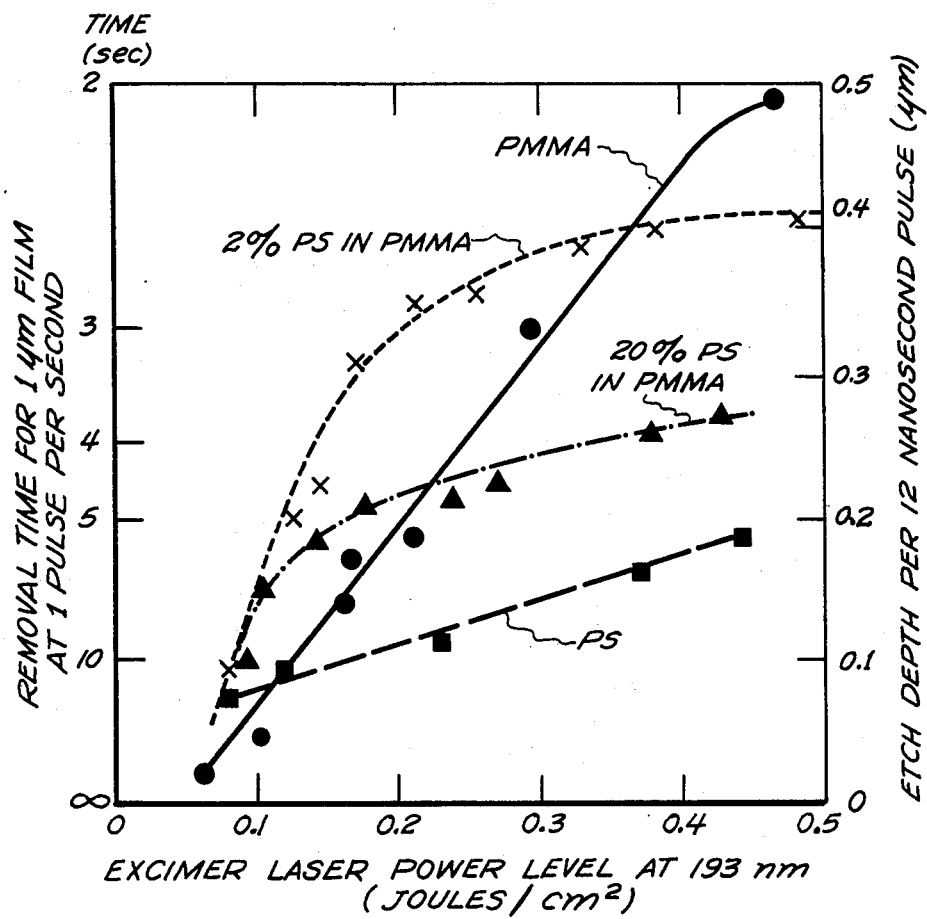

PROCESS FOR REMOVING ORGANIC MATERIAL IN A PATTERNED MANNER FROM AN ORGANIC FILM

BACKGROUND OF THE INVENTION

Prior to the present invention, as shown by Wright et al., U.S. Pat. No. 3,664,899, assigned to the same assignee as the present invention and incorporated herein by reference, a method for removing organic polymeric film from a substrate was provided utilizing ultraviolet light at wavelengths below 3500 Angstroms in the presence of oxygen. Although the dry film removal process of Wright et al. represented a significant advantage over wet film removal methods utilizing organic solvents and mechanical action such as scraping, the patterned removal of photoresists from various substrate by the method of Wright et al. nevertheless required several minutes.

An improved procedure for providing patterned removal of organic material from applied organic photoresist, useful in the fabrication of microelectronic devices, is shown by Blum et al., U.S. Pat. No. 4,414,059. Blum et al. utilize ablative photodecomposition (APD) and radiation at a wavelength of 193 nanometers. In order to achieve sufficient power density (or energy fluence), a pulsed radiation source is used, such as produced by an ArF excimer laser providing pulses approximately 10 nanoseconds wide at 193 nanometers. The critical threshold energy fluence is approximately 10–15 $mJ/cm^2$ per 10 nanosecond pulse. According to Blum et al., ablative photodecomposition leads to extremely high etch rates, being at least 30 times as great as those obtainable in oxidative removal processes.

Even though significant advances in rate of patterned removal of organic material from organic films has been achieved, improvements in the removal rate of organic material in a patterned manner from organic film on a substrate are constantly being sought.

The present invention is based on our discovery that a substantial enhancement in the rate of patterned organic material removal from applied organic films can be achieved by modifying the composition of the applied organic films. More particularly, we have found that a substantial enhancement in the rate of removal of organic material in a patterned manner from an applied organic film can be achieved by utilizing organic polymeric film made from a blend of aliphatic organic polymer and aromatic organic material, or aromatic organic copolymer consisting essentially of chemically combined aliphatic organic units and aromatic organic units. In order to achieve optimum removal rate of organic material, we have found that aromatic organic units must be present in the blend or copolymer at particular proportions by weight, as defined below.

As defined hereinafter, the expression "removal rate of patterned organic material" means the depth in micrometers ablatively etched, per incident pulse. The pulse duration for the ArF laser at 193 nanometers is 12 nanoseconds. The removal rate can be determined by dividing the total thickness of etched material by the total number of incident pulses. As shown in the drawing, an excimer laser operated at a wavelength of 193 nanometers and a power level of 0.1 to 0.5 $joules/cm^2$ is capable of effecting a removal rate of between about 0.1 $\mu m$ to 0.5 $\mu m$, per pulse, of various organic films, where "PS" is poly($\alpha$-methylstyrene), PMMA is polymethylmethacrylate and 2% and 20% is in weight percent.

Although the laser is capable of a repeat rate of 25 pulses per second, it was operated at 1 pulse per second in the evaluation. Hence, the rates shown are in thicknesses removed per second. These values would be increased if a higher excimer laser pulse repetition rate were used.

STATEMENT OF THE INVENTION

There is provided by the present invention, a process for effecting the removal of organic material in a patterned manner from organic polymeric film by irradiating such organic polymeric film with ultraviolet light which preferably has a wavelength of less than 300 nanometers and sufficient power density to at least produce ablative photodecomposition and preferably up to about 0.4 $joules/cm^2$, which comprises the improvement of using in such patterned organic material removal process, organic polymeric film which is a member selected from the class consisting of (A) a blend of aliphatic organic polymer and aromatic organic material selected from the class consisting of aromatic organic polymer and aromatic organic monomer having from 1% to 20% by weight of the blend of such aromatic organic material and preferably from 1% to 5% by weight, and (B) organic polymer consisting essentially of from 50% to 99% by weight and preferably from 90% to 99% of aliphatic organic units chemically combined with from 1% to 50% by weight and preferably from 1% to 10%, of aromatic organic units, whereby the removal rate of such patterned organic material from such organic polymeric film under such irradiating conditions is substantially enhanced.

Some of the aliphatic organic polymers which can be used in the practice of the present invention are, for example, acryloid polymers of the Rohm and Haas Company and Elvacite resins of E.I. DuPont deNemours Company. There are included polymers such as
Poly(methyl acrylate)
Poly(methyl methacrylate)
Poly(butyl acrylate)
Poly(butyl methacrylate)
Poly(tert-butyl methacrylate)
Poly(cyclohexyl methacrylate)
Poly(ethyl acrylate)
Poly(ethylene succinate)
Poly(2-ethylhexyl acrylate)
Poly(2-ethylhexyl methacrylate)
Poly(ethyl methacrylate)
Poly(hexadecyl methacrylate)
Poly(hexyl methacrylate)
Poly(2-hydroxyethyl methacrylate)
Poly(2-hydroxypropyl methacrylate)
Poly(isobutyl methacrylate)
Poly(isopropyl methacrylate)
Poly(octadecyl methacrylate)
Poly(octyl acrylate).
There are also included aliphatic polymers such as
Poly(vinyl acetate)
Poly(vinyl methyl ether)
Poly(vinylstearate)
Octadecyl vinylether/maleic anhydride copolymer
Butyl vinylether/maleic anhydride copolymer and
Cetyl vinylether/maleic anhydride copolymer.

Some of the aromatic organic materials which can be used in the practice of the present invention to form a blend with one or more of the above-described aliphatic organic materials are, for example, aromatic organic polymers such as HIPS or high impact polystyrene. Cizek, U.S. Pat. No. 3,383,435, incorporated herein by reference, shows additional examples of useful blendable aromatic organic polymers. Further examples of aromatic organic polymers are as follows.

Poly($\alpha$-methylstyrene)
Poly(styrene)
Poly(benzyl methacrylate)
Poly(4-tert-butylstyrene)
Poly(4-isopropylstyrene)
Poly(4-methoxystyrene)
Poly(4-methylstyrene)
Poly(vinyltoluene)
Poly(4-vinylbiphenyl).

In addition, there also can be blended with the above-described aliphatic organic polymers aromatic organic monomers such as biphenylcarbonitrile, 9-anthronitrile, terphenyl, biphenyl, nitrobiphenyl, phenyl benzoate and other soluble aromatic organic compounds.

One procedure for making the above-described organic film-forming blends useful in photolithographic techniques is by solution blending the above-described amount of aliphatic organic polymer with the organic material and thereafter casting the resulting organic film-forming blend onto a suitable substrate. Suitable substrates are, for example, quartz, silicon, metal films and integrated circuit parts. Solvents which can be used to solution blend the aforementioned ingredients are, for example, benzene, toluene, xylene, butyl acetate, methyl isobutyl ketone, cyclohexanone and the like.

Copolymers of the aliphatic organic monomers such as methylmethacrylate and maleic anhydride with an aromatic organic monomer, such as styrene, can be copolymerized by standard techniques utilizing a free radical initiator; for example, benzoylperoxide, etc. The resulting organic copolymer of chemically combined aliphatic units and aromatic units can thereafter be applied onto the surface of a suitable substrate by standard techniques such as by casting from an inert organic solvent as previously defined.

In achieving the desirable level of removal of organic material in a patterned manner, a suitable pulse radiation source can be used rather than a continuous source in order to provide a sufficient amount of photons in the irradiated area of the resist in a very short amount of time. It is preferred to use an ArF excimer laser providing pulses approximately 12 nanoseconds wide at 193 nanometers. Critical energy fluence which can be used is approximately 10 to 500 mJ/cm$^2$. Radiation can proceed in a vacuum, in a gaseous environment or in oxygen or air.

In order that those skilled in the art will be better able to practice the present invention, the following examples are given by way of illustration and not by way of limitation. All parts are by weight.

EXAMPLE 1

Solutions of polymethylmethacrylate and poly($\alpha$-methylstyrene) were made in toluene. Blends of these solutions were then prepared having 2% poly($\alpha$-methylstyrene) by weight in polymethylmethacrylate and 20% poly($\alpha$-methylstyrene) in polymethylmethacrylate. The various solutions at 20% by weight solids were spin coated on respective 2 inch ×2 inch quartz plates. There was obtained smooth uniform films of about 3-4 microns thick on the quartz substrates of blends of 2% poly($\alpha$-methylstyrene) and 20% poly($\alpha$-methylstyrene) in polymethylmethacrylate. Films of 100% poly($\alpha$-methylstyrene) and polymethylmethacrylate were also applied onto quartz plates.

The various coated quartz plates were then heated under reduced pressure to remove residual toluene. Patterned removal of organic material from the various coated quartz substrates was effected with a Lambda Physik ArF excimer laser at 193 nanometers using a 12 nanosecond pulse duration. The irradiated pulse energy was controlled by varying the quartz lens to sample distance. The fluence, defined as the energy irradiated per unit area per pulse, was then calculated from a measurement of the irradiated area on a given sample. The depth of etched holes was measured using a Sloan Dektak II depth profiler. The depth of etching, per pulse, was averaged over several runs at each fluence level. The various samples were then measured for a rate of removal of organic material using a laser pulse of 12 nanoseconds duration per second while operating the excimer laser at a power level at 193 nanometers from 0.1 to 0.5 joules/cm$^2$. The following results were obtained which are further illustrated in the drawing.

TABLE I

| Polymer | *Time required to remove 1 $\mu$m thick film |
| --- | --- |
| PMMA | 14.3 sec |
| Blend of PMMA + 2% by weight of poly($\alpha$-methylstyrene) | 6.7 sec |
| Blend of PMMA + 20% by weight of poly($\alpha$-methylstyrene) | 7.1 sec |
| Poly($\alpha$-methylstyrene) | 12.5 sec |

*Excimer laser power = .1 J/cm$^2$, 12 nanosecond pulses at 1 pulse per second.

The above results show that a blend of aromatic and aliphatic material provides a superior removal rate as comparted to films obtained from the pure aliphatic material (PMMA) or the pure aromatic material [poly-($\alpha$-methylstyrene)].

EXAMPLE 2

Several quartz substrates, 2 inches ×2 inches were spin-coated with a variety of solutions in toluene of butyl vinyl ether-maleic anhydride copolymer, styrene allylalcohol copolymer and blends thereof. The coating solutions utilized had 20% solids. The blends consisted of 1% to 10% by weight of the styrene allylalcohol copolymer and correspondingly from 90–99% by weight of the butyl vinyl ether-maleic anhydride copolymer. There was obtained quartz substrates having organic polymeric film coatings of from 3–5 microns. The coated substrates were baked at 120° C. for one hour to bake out any last traces of solvent.

The coated substrates were then irradiated using a Lambda Physik ArF excimer laser at 193 nanometers with a 12 nanosecond pulse duration. The irradiated pulse energy was controlled by varying the quartz lens to sample distance. The fluence, defined as the energy irradiated per unit area per pulse, was calculated from a measurement of the irradiated area on a given sample. The depth of etched holes was measured using a Sloan Dektak II depth profiler. The depth of etching per pulse was averaged over several runs at each fluence level. In Table II, "BVE/MA" means butylvinylethermaleic anhydride copolymer and "STAA" means styrene/allylalcohol copolymer.

TABLE II

| Polymer sample | *Time required to remove 1 μm thick film |
| --- | --- |
| BVE/MA | 16.7 sec |
| BVE/MA + 1% | 5.6 sec |
| BVE/MA + 2.5% STAA | 5.6 sec |
| BVE/MA + 5% STAA | 9.1 sec |
| BVE/MA + 10% STAA | 12.5 sec |

*Excimer laser power = 0.1 J/cm$^2$, 12 nanosecond pulses at 1 pulse per second.

The above results further show that blends of aliphatic polymer and aromatic polymer provide superior removal rates compared to films made from pure aliphatic material or aromatic material.

Although the above examples are directed to only a few of the very many variables which can be used in the practice of the method of the present invention, it should be understood that the present invention is directed to the use of a much broader variety of aliphatic and aromatic organic materials to make the blends as well as copolymers as described in the description preceding these examples to achieve an optimum rate.

What is claimed is:

1. A process for effecting the removal of organic material in a patterned manner from organic polymeric film by irradiating such organic polymeric film with ultraviolet light having sufficient power density to produce ablative photodecomposition, which comprises the improvement of using in such patterned organic material removal process, organic polymeric film which is a member selected from the class consisting of
   (A) a blend of aliphatic organic polymer and aromatic organic material selected from the class consisting of aromatic organic polymer and aromatic organic monomer having from about 1% to about 20% by weight of the blend of such aromatic organic material, and
   (B) organic polymer consisting essentially of from about 50% to 99% of aliphatic organic units chemically combined with from about 1% to 50% of aromatic organic units,
whereby the removal rate of such patterned organic material from such organic polymeric film under such irradiating conditions is substantially enhanced.

2. A process in accordance with claim 1 where the organic polymeric film is obtained from a blend of aliphatic organic polymer and aromatic organic material.

3. A method in accordance with the process of claim 1, where the ablative photodecomposition is achieved by the use of pulse radiation having a fluence greater than 0.1 J/cm$^2$/pulse.

4. A method in accordance with claim 1, where the ultraviolet radiation has a wavelength of 193 nanometers.

5. A method in accordance with claim 1, utilizing an organic polymeric film which is made from a copolymer consisting essentially of chemically combined aliphatic organic units and aromatic organic units.

6. A method in accordance with claim 1, where the organic polymeric film is a blend of polymethylmethacrylate and polystyrene.

7. A method in accordance with claim 1, where the aromatic organic polymeric film is a blend of butyl vinyl ether-maleic anhydride copolymers and styrene and allylalcohol copolymer.

* * * * *